United States Patent
Bauer et al.

(10) Patent No.: US 8,456,023 B2
(45) Date of Patent: Jun. 4, 2013

(54) SEMICONDUCTOR WAFER PROCESSING

(75) Inventors: Robert Bauer, Ismaning (DE); Anton Kolbeck, Röhrmoos (DE)

(73) Assignee: Freescale Semiconductor, Inc., Austin, TX (US)

( * ) Notice: Subject to any disclaimer, the term of this patent is extended or adjusted under 35 U.S.C. 154(b) by 205 days.

(21) Appl. No.: 12/596,267

(22) PCT Filed: Apr. 27, 2007

(86) PCT No.: PCT/IB2007/051576
§ 371 (c)(1),
(2), (4) Date: Jun. 3, 2011

(87) PCT Pub. No.: WO2008/132559
PCT Pub. Date: Nov. 6, 2008

(65) Prior Publication Data
US 2011/0227229 A1    Sep. 22, 2011

(51) Int. Cl.
*H01L 29/40* (2006.01)
*H01L 21/44* (2006.01)

(52) U.S. Cl.
USPC .... 257/779; 257/772; 257/773; 257/E21.599; 257/E23.068; 438/612

(58) Field of Classification Search
USPC ................. 257/622, 772, 773, 778, 779, 783, 257/774, 751, 758, E23.011, E21.158, 276, 257/625, 675, 706, 707, 712–722, 796, E33.075, E31.131, E23.051, E23.08–E23.113, 257/E21.599, E23.01, E23.068; 228/221, 228/124.5; 438/612
See application file for complete search history.

(56) References Cited

U.S. PATENT DOCUMENTS

| | | | |
|---|---|---|---|
| 4,793,543 A * | 12/1988 | Gainey et al. | 228/121 |
| 6,184,570 B1 * | 2/2001 | MacDonald et al. | 257/622 |
| 6,362,435 B1 | 3/2002 | Downey et al. | |
| 2002/0100973 A1 | 8/2002 | Akram et al. | |
| 2003/0197281 A1 | 10/2003 | Farnworth et al. | |
| 2004/0124543 A1 | 7/2004 | Condie et al. | |
| 2005/0277280 A1 * | 12/2005 | Brunschwiler et al. | 438/616 |

FOREIGN PATENT DOCUMENTS

| | | |
|---|---|---|
| JP | 04315446 A | 11/1992 |
| JP | 07176546 A | 7/1995 |
| JP | 07249644 A | 9/1995 |
| JP | 10079397 A | 3/1998 |
| JP | 2003318203 A | 11/2003 |

OTHER PUBLICATIONS

International Search Report and Written Opinion correlating to PCT/IB2007/051576 dated Apr. 27, 2007.

* cited by examiner

*Primary Examiner* — Jasmine Clark

(57) ABSTRACT

A method of processing a semiconductor wafer is provided which comprises treating a metallization layer provided on a backside of the wafer to form a plurality of channels therein, such that at least some of the channels along substantially the length thereof extend through the thickness of the metallization layer to the backside of the wafer, thereby exposing the material of the backside of the wafer. When the semiconductor wafer is separated into dies, each die is provided with a plurality of channels, which extend to an edge of the die. On attaching the die to a die attach flag by solder, the solder does not stick to the exposed material of the backside of the die, and channels are thereby formed in the solder. This allows venting of gases formed in the solder, and decreases void formation in the solder.

20 Claims, 2 Drawing Sheets

SEMICONDUCTOR WAFER PROCESSING

FIELD OF THE INVENTION

This invention relates to a method of processing a semiconductor wafer.

BACKGROUND OF THE INVENTION

In the fabrication of electronic devices, it is usual to initially grow a semiconductor wafer from silicon. A top side of the semiconductor wafer is then processed to form a plurality of electronic devices, e.g. transistors etc., on the wafer. A backside of the semiconductor wafer is provided with at least one metallisation layer. The semiconductor wafer is then sawed into a plurality of individual sections, or dies, each comprising at least one electronic device. When a die comprising at least one device is to be attached to, for example, a circuit board for use, it is the metallisation layer on the backside of the die which is used for attaching the die. This is commonly achieved by using solder to attach the die to a die attach flag of the board, the die attach flag being manufactured from a conductive material. The die is then in electrical and thermal contact with the board.

In the process of soldering a die onto a die attach flag, it is not unusual to get voids or gas bubbles in the solder joint between the die and the die attach flag. This is undesirable for a number of reasons. The presence of voids can affect the thermal and electrical performance of the die, by changing the electrical and thermal path within the solder joint. In normal operation of the one or more electronic devices on the die, heat is generated. This is dissipated by transfer to the die attach flag, which comprises a conductive material and acts as a heat sink. The heat is dissipated to the die attach flag via the metallisation layer of the die and the solder joint between the die and the die attach flag. If voids are present in the solder joint, these will affect the dissipation of the heat. This is undesirable, as it may lead to overheating of the electronic devices on the die in operation. In a worst case, this might cause local overheating and damage of a device.

U.S. Pat. No. 6,362,435 describes the modification of a conductor pad formed on a substrate or a printed circuit board, to reduce the problem of void formation on attachment of an electronic device to the conductor pad. The conductor pad comprises a uniform and electrically conductive base layer. A patterned layer is provided on top of the base layer. Either the base layer or the patterned layer is substantially non-wettable (i.e. solder will not adhere thereto), and together the base layer and the patterned layer strips of non-wettable surface areas. When an electronic device is attached to the conductor pad using solder, this will not adhere to the strips, thus providing paths in the solder joint for escape of gases formed in the soldering process. This provides a reduction in the formation of gas voids in the solder. The method described in this document is limited to patterning of substrates and printed circuit boards, and the described solution to the formation of voids, requires a 'stack-up' structure, i.e. consisting of two layers.

There remains a need for improving current die solder attach processes, in order to achieve a minimum voiding level in mass production.

SUMMARY OF THE INVENTION

The present invention provides a method of processing a semiconductor wafer, a semiconductor wafer, a semiconductor device and a semiconductor device attached to a solder die as described in the accompanying claims.

BRIEF DESCRIPTION OF THE DRAWINGS

Reference will now be made, by way of example, to the accompanying drawings, in which.

DETAILED DESCRIPTION OF THE PREFERRED EMBODIMENT

Figure 1:
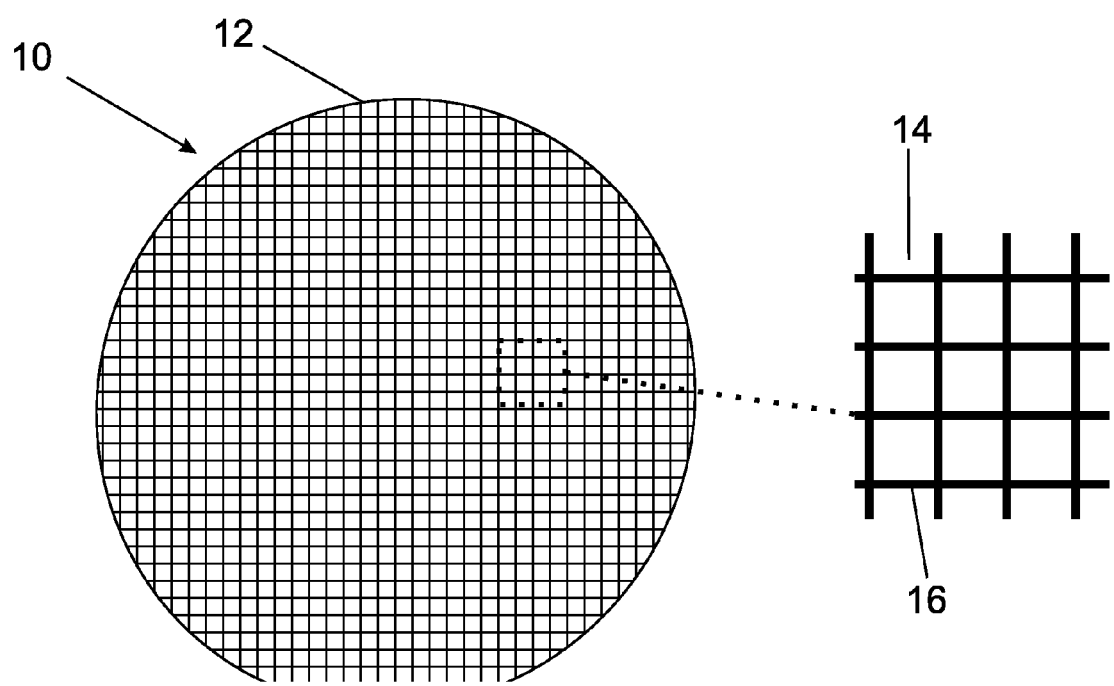
FIG. 1 is a schematic representation of a semiconductor wafer processed in accordance with one embodiment of the invention, given by way of example.

Referring to FIG. 1, a method of processing a semiconductor wafer according to one embodiment of the invention, will be described. The semiconductor wafer 10 is manufactured using conventional processes. A top side of the semiconductor wafer is processed to form a plurality of electronic devices thereon, and a backside 12 of the semiconductor wafer 10 is provided with a metallisation layer 14.

The metallisation layer 14 is treated to form a plurality of channels 16 therein. This could comprise providing the metallisation layer 14 on the wafer, and then processing the layer, e.g. by selective etching, to form the channels therein. This could comprise providing the metallisation layer 14 on the wafer, applying a photoimagable mask to the layer 14, applying radiation to the layer and mask, removing the mask, and stripping away portions of the metallisation layer to form the channels This could comprise applying a mask to the backside of the wafer 10, and providing the metallisation layer 14 on the wafer by, for example, evaporating metal onto the backside of the wafer through the mask, forming channels in the layer. Thus a structure having channels and comprising only one layer is provided on the semiconductor wafer 10.

Substantially all of the channels 16 along substantially the whole length thereof, extend through the metallisation layer 14 to the backside 12 of the semiconductor wafer 10 beneath the layer 14, thus exposing the material of the backside 12 of the semiconductor wafer 10, which material conventionally will be silicon. The depth of the channels 16 is therefore substantially equal to that of the metallisation layer 14. The width of the channels 16 is preferably of the order of 100 to 200 μm. The width of the channels may depend on the size of the semiconductor wafer 10, and the size of dies formed therefrom.

The channels 16 are preferably formed in a pattern. The pattern is preferably regular in structure. The shape of the pattern is not crucial, for example a square or rectangular pattern etc. may be used. Referring to FIG. 1, the channels 16 may be formed in a cross-hatch pattern, as shown by way of example only.

The channels 16 are formed in the metallisation layer 14 such that when the semiconductor wafer 10 is cut up into separate dies, each die will be provided with a plurality of channels. At least some of the channels, and preferably most of the channels, will extend to an edge of the die. Alignment of the pattern of channels 16 with the die array pattern on the semiconductor wafer 10 is not therefore necessary.

The semiconductor wafer 10 is thus provided with a metallisation layer 14 comprising a plurality of channels 16.

In use, the semiconductor wafer 10 is then sawed into a plurality of individual dies, each comprising at least one electronic device, and a portion of the metallisation layer 14

Figure 2:
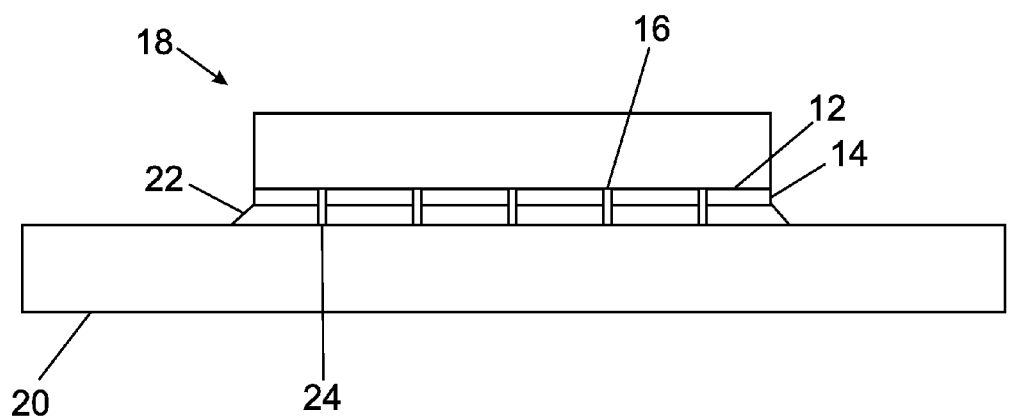
FIG. 2 is a schematic representation of a semiconductor device on a die of the wafer of FIG. 1, attached to a die attach flag, given by way of example.

(see FIG. 2). When a die 18 is to be attached to, for example, a circuit board for use, it is attached to a die attach flag 20 of the board. A reflow process is used, in which solder is applied to the metallisation layer 14 of the die 18. The solder will stick to the metallisation layer 14, to form a solder joint 22 between the layer 14 and the die attach flag 20. However, as the channels 16 in the metallisation layer 14 extend through to the backside 12 of the die 18, the material of the backside 12 of the die 18 (usually silicon) will be exposed in the channels 16. Solder does not stick to bare silicon, and hence channels 24 will be formed in the solder, as shown. Various kinds of solder alloy can be used in the reflow process, as none of these will stick to silicon. As the channels 16 of the metallisation layer 14 of the die 18 extend to an edge of the die 18, the channels 24 in the solder will also extend to the edge of the die 18. Thus, during the reflow process, any gases, e.g. air and flux content, produced during the process by the heating of the solder, will be able to be vented through the channels 24 to the edges of the die 18. This results in lower void formation levels in the completed solder joint 22.

The invention thus modifies a process of providing a metallisation layer on the backside of a semiconductor wafer, in a way that allows better, more reliable attachment of dies formed from the wafer to die attach flags, due to a decrease in void formation. This will yield an improved and easier to control die/PCB assembly process, and more consistent electronic device quality. The method of the invention provides a reduction in void formation, without the need to pattern substrates and printed circuit boards, and without the need to provide a voiding structure consisting of a plurality of layers.

It will be appreciated that the above described invention may include various variations and alternatives which will produce the same advantages as the features described herein, and these are hereby included.

The invention claimed is:

1. A method of processing a semiconductor wafer, comprising:
treating a metallisation layer, to which solder sticks, provided on a backside of the wafer to form a plurality of channels therein, wherein at least some of the channels along substantially a length thereof extend through a thickness of the metallisation layer to the backside of the wafer, thereby exposing the backside of the wafer, the backside of the wafer comprising a material to which the solder does not stick.

2. A method as claimed in claim 1, including: cutting the semiconductor wafer into separate dies; and forming a solder joint between said metallisation layer and a die attach flag, for attaching the die to the die attach flag.

3. A method as claimed in claim 1, wherein treating the metallisation layer comprises providing the metallisation layer on the semiconductor wafer and processing the layer by selective etching to form the channels.

4. A method as claimed in claim 1, wherein treating the metallisation layer comprises providing the metallisation layer on the semiconductor wafer, applying a photoimagable mask to the layer, applying radiation to the layer and the mask, removing the mask, and stripping away portions of the metallisation layer to form the channels.

5. A method as claimed in claim 1, wherein treating the metallisation layer comprises applying a mask to the backside of the semiconductor wafer, and providing the layer on the wafer by evaporating metal onto the backside of the wafer through the mask to form the channels.

6. A method as claimed in claim 1, wherein the channels are formed in a pattern.

7. A method as claimed in claim 6, wherein the pattern is regular in structure.

8. A method as claimed in claim 6, wherein the pattern comprises a cross-hatch pattern.

9. A method as claimed in claim 1, wherein the channels are formed in the metallisation layer such that on cutting the semiconductor wafer into separate dies, each die is provided with a plurality of channels.

10. A method as claimed in claim 9, wherein at least some of the channels extend to an edge of the die.

11. A semiconductor wafer comprising:
a metallisation layer, to which solder sticks, attached to a backside of the wafer, wherein the metallisation layer comprises a plurality of channels therein, at least some of the channels along substantially a length thereof extending through a thickness of the metallisation layer to the backside of the wafer, thereby exposing the backside of the wafer, the backside of the wafer comprising a material to which the solder does not stick.

12. A semiconductor device comprising:
a die including a metallisation layer, to which solder sticks, attached to a backside of the die, wherein the metallisation layer comprises a plurality of channels therein, at least some of the channels along substantially a length thereof extending through a thickness of the metallisation layer to the backside of the die, thereby exposing the backside of the die, the backside of the comprising a material to which the solder does not stick.

13. A semiconductor device as claimed in claim 12, wherein at least some of the channels extend to an edge of the die.

14. A semiconductor device as claimed in claim 12, wherein the channels are formed in a pattern.

15. A semiconductor device as claimed in claim 14, wherein the pattern is regular in structure.

16. A semiconductor device as claimed in claim 14, wherein the pattern comprises a cross-hatch pattern.

17. A semiconductor device as claimed in claim 12, wherein the metallisation layer is attached by a solder joint to a die attach flag, and the solder comprises channels substantially in correspondence with the channels of the metallisation layer.

18. A semiconductor device as claimed in claim 13, wherein the channels are formed in a pattern.

19. A semiconductor device as claimed in claim 15, wherein the pattern comprises a cross-hatch pattern.

20. A semiconductor device as claimed in claim 13, wherein the metallisation layer is attached by a solder joint to a die attach flag, and the solder comprises channels substantially in correspondence with the channels of the metallisation layer.

* * * * *